United States Patent
Hsu et al.

(10) Patent No.: US 6,906,376 B1
(45) Date of Patent: Jun. 14, 2005

(54) EEPROM CELL STRUCTURE AND ARRAY ARCHITECTURE

(75) Inventors: Fu-Chang Hsu, San Jose, CA (US); Hsing-Ya Tsao, San Jose, CA (US)

(73) Assignee: A Plus Flash Technology, Inc., San Jose, CA (US)

(*) Notice: Subject to any disclaimer, the term of this patent is extended or adjusted under 35 U.S.C. 154(b) by 31 days.

(21) Appl. No.: 10/170,492

(22) Filed: Jun. 13, 2002

(51) Int. Cl.[7] ............................................. H01L 29/788
(52) U.S. Cl. ..................... 257/315; 257/314; 257/316; 257/320; 438/201; 438/211; 438/257
(58) Field of Search ................................. 257/314, 315, 257/316, 318, 320, 326; 438/201, 211, 257, 262

(56) References Cited

U.S. PATENT DOCUMENTS

| | | | |
|---|---|---|---|
| 5,482,881 A | * 1/1996 | Chen et al. | 437/43 |
| 5,679,970 A | * 10/1997 | Hartmann | 257/320 |
| 5,698,879 A | * 12/1997 | Aritome et al. | 257/315 |
| 5,726,470 A | * 3/1998 | Sato | 257/316 |
| 5,760,438 A | * 6/1998 | Sethi et al. | 257/317 |
| 5,894,146 A | * 4/1999 | Pio et al. | 257/319 |
| 6,232,634 B1 | * 5/2001 | Wu et al. | 257/316 |
| 6,259,132 B1 | * 7/2001 | Pio | 257/315 |

* cited by examiner

*Primary Examiner*—George Eckert
*Assistant Examiner*—Edgardo Ortiz
(74) *Attorney, Agent, or Firm*—George O. Saile; Stephen B. Ackerman; Douglas R. Schnabel

(57) ABSTRACT

An EEPROM cell device on a substrate is achieved. The device comprises, first, a selection transistor having gate, drain, source, and channel. The drain is defined as a cell bit line. An isolation transistor has gate, drain, source, and channel. The source is defined as a cell source line. Finally, a floating gate transistor has control gate, floating gate, drain, source, and channel. The drains and sources of each transistor comprise a diffusion layer in the substrate. The channels of each transistor comprise the substrate. The floating gate transistor drain is coupled to the selection transistor source. The floating gate transistor source is coupled to the isolation transistor drain. The device is programmed and erased by charge tunneling between the floating gate and the floating gate transistor channel. The device may further comprise an isolation well underlying the diffusion layer. A two transistor EEPROM cell is disclosed. Several array architectures using the EEPROM cell are disclosed.

2 Claims, 12 Drawing Sheets

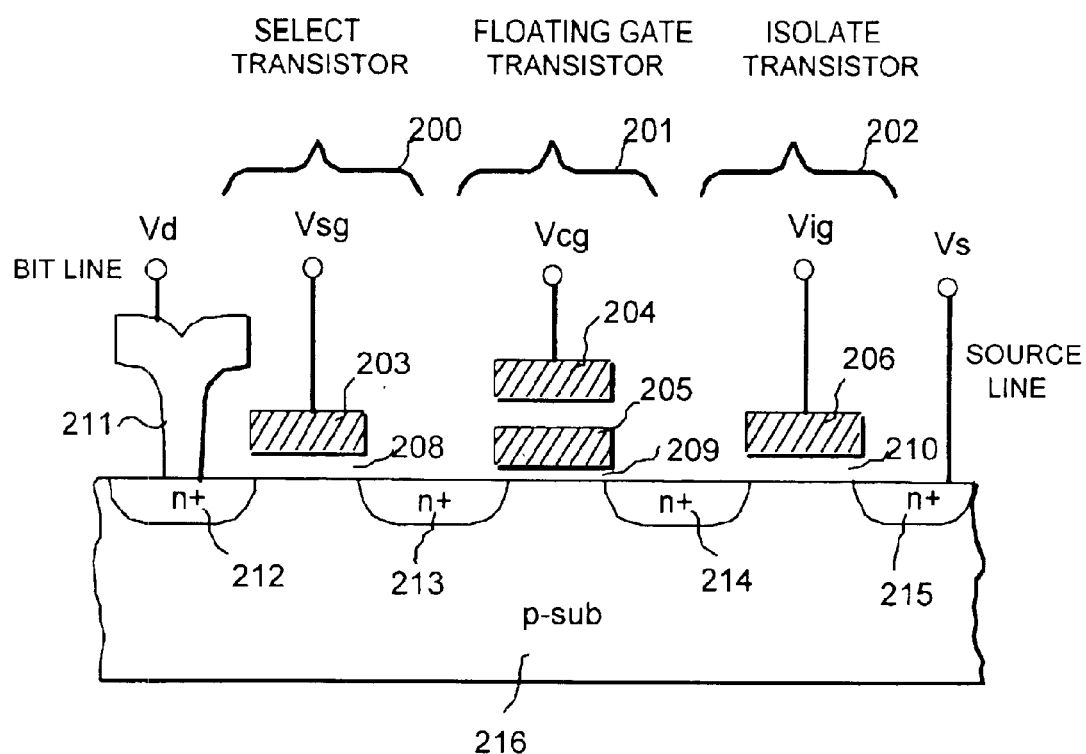
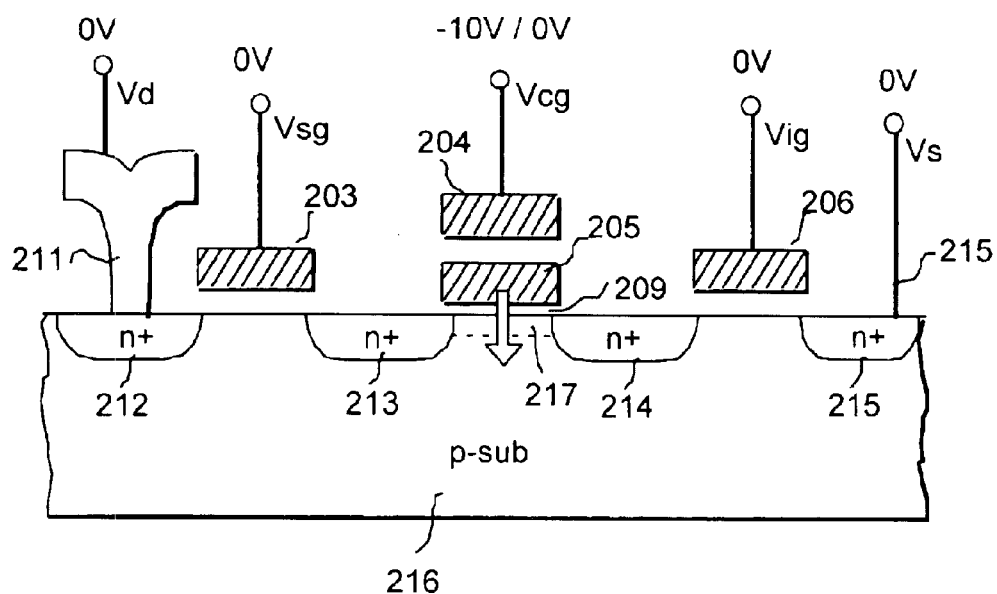

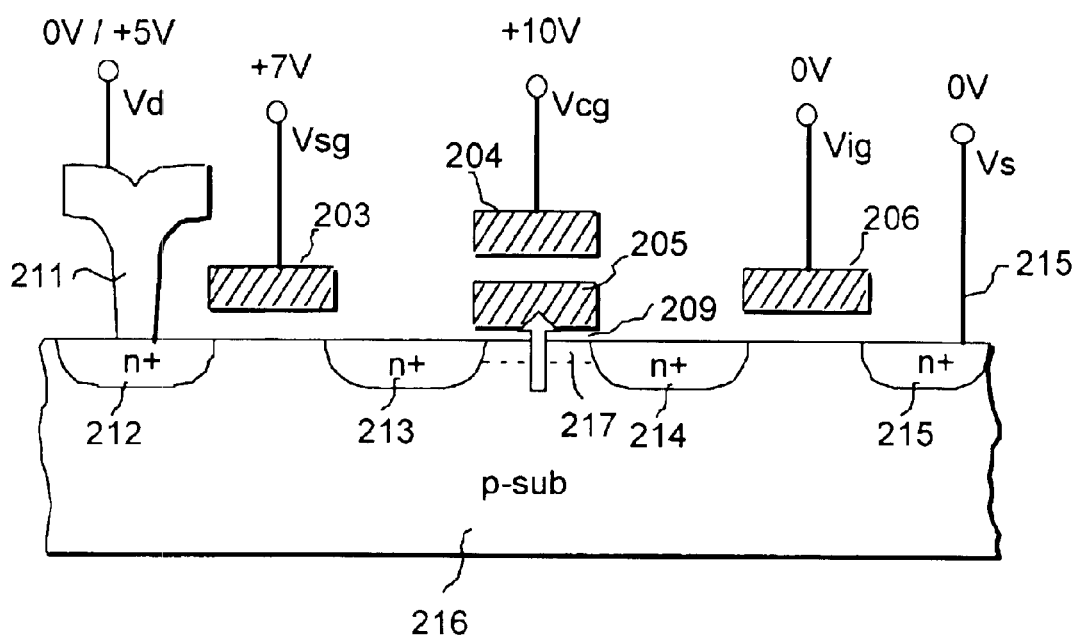
FIG.3B  PROGRAM CONDITION
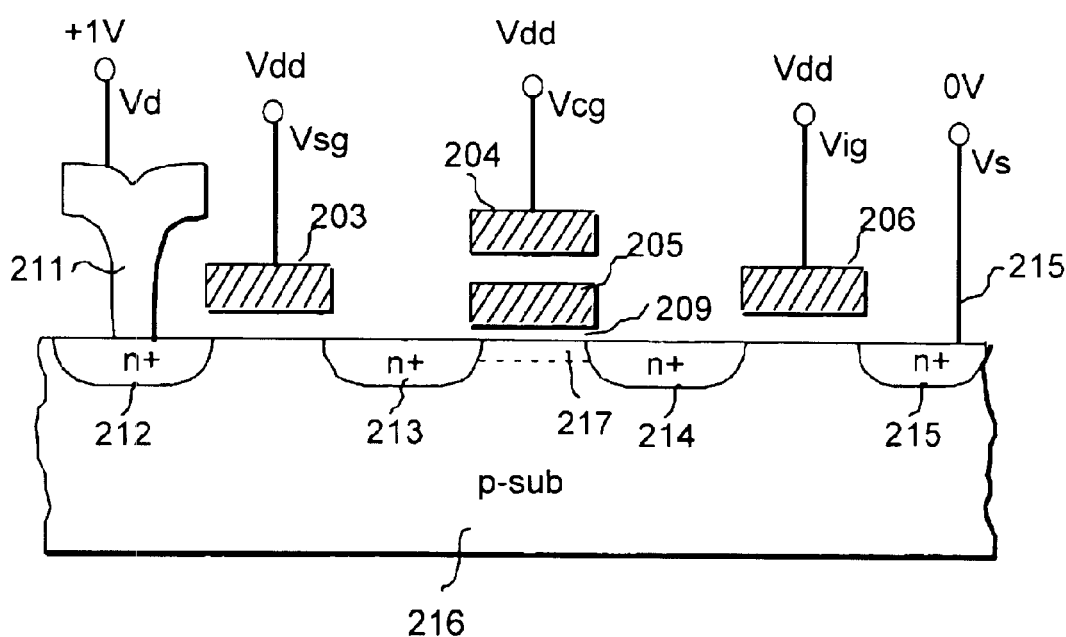
FIG.3C  READ CONDITION

EEPROM CELL STRUCTURE AND ARRAY ARCHITECTURE

This Patent Application claims priority to the U.S. Provisional Patent Application 60/283,450, filed on Apr. 12, 2001, which is herein incorporated by reference in its entirety.

BACKGROUND OF THE INVENTION (1) Field of the Invention

The invention relates to an integrated circuit memory cell structure and array architecture, and, more particularly, to a novel EEPROM cell structure and array architecture with improved scalability, manufacturability, and endurance.

(2) Description of the Prior Art

The electrically erasable, programmable read only memory (EEPROM) is widely used in today's electronic devices. This is especially true for hand held devices. Because of the advantages of nonvolatility, low operating current, and unique byte alterability, the EEPROM has become an important component in the memory market.

Flash memory devices have been developed more recently than EEPROM devices. Both memory types are nonvolatile. However, the Flash memory lacks the same byte erasing and re-programming options of the EEPROM. Generally, the data of the Flash memory must be altered in large sized blocks. This limitation makes Flash memory less desirable for many applications.

The basic EEPROM is a double polysilicon gate transistor. The data is stored on the floating gate as an electron charge. This electron charge can be altered to thereby change the threshold voltage of the transistor as controlled by the control gate. During a reading operation, the threshold voltage of the cell will determine the current flowing through the channel region of the memory cell. This current level can then be sensed and decoded into a logical '0' or '1.' To change the stored data, two operations may be performed on the EEPROM cell to increase or decrease the charge stored on the floating gate: erase and program. For a conventional EEPROM cell, both erase and program operations are based on the well-known Fowler-Nordheim (FN) tunneling mechanism.

As the manufacturing technology of semiconductors is scaled down to smaller device geometry, thinner dielectric layers, and narrower channel widths, the EEPROM technology has experienced many problems. Most of these problems are because the conventional EEPROM cell requires a high voltage of between about 12 Volts and 15 Volts in the bit line diffusion to perform the erase and program operations. In addition, the conventional EEPROM cell structure is very complex. These two factors create manufacturing and scaling difficulties. As a result, the manufacturing cost of the conventional EEPROM has become higher, the cell size has become bigger and un-shrinkable, and the array density is limited to low density devices. The present invention is designed to solve these problems of the prior art by providing a simpler EEPROM cell structure with better scalability and longer endurance cycles.

Referring now to FIG. 1, a prior art, conventional EEPROM cell is shown. The cell includes two transistors, a floating gate transistor 101 and a selection transistor 100 formed on a substrate 112. The floating gate transistor 101 is the memory cell device to store the data. The selection transistor 100 performs an isolation function to prevent the data stored on the floating gate transistor 101 from being disturbed by a high voltage applied to the bit line 106. The erasing, programming, and reading conditions for the EEPROM cell are summarized below in Table 1.

TABLE 1

Operation Conditions for Conventional EEPROM Cell.

| Operation | | Vd | Vsg | Vcg | Vs |
|---|---|---|---|---|---|
| Erase | Selected | 0 V | 0 V | +10 V | 0 V |
|  | Deselected | 0 V | 0 V | 0 V | 0 V |
| Program | Selected | +10 V | >= +10 V | 0 V | 0 V |
|  | Deselected | 0 V | >= +10 V | 0 V | 0 V |
| Read | Selected | $\iota$ + 1 V | Vdd | Vdd | 0 V |
|  | Deselected | 0 V | 0 V | Vdd | 0 V |

For an erase operation, the control gate 104 of the selected cell is applied with a positive high voltage of, for example, about +12 Volts. The drain diffusion region 109 of the cell is applied with a relatively low voltage of about 0 Volts. Under such bias conditions, the large voltage difference between the control gate 104 and the diffusion region 109 will create a strong electric field across the tunnel oxide window 103 located between the floating gate 105 and diffusion region 109. This strong electric field will overcome the tunneling energy barrier of the tunnel oxide and cause the FN tunneling phenomenon to occur. The electron charge will be induced and injected from the diffusion region 109 to the floating gate 105 through the tunnel oxide window 103. This injection causes the threshold voltage of the floating gate transistor 101 to increase and makes the cell a logical data '1' cell.

The programming operation is performed in the opposite way. For the cell being programmed, the drain diffusion 109 is biased to a large positive voltage, such as about +12 Volts. The control gate 104 is bias to the low voltage of about 0 Volts. This condition will cause the same strong electric field but in the reverse direction. The electron charge is injected from the floating gate 105 to the drain diffusion 109 through the tunnel oxide window 103. The programmed cell threshold voltage is decreased, and it becomes a data '0' cell.

Note that for the prior art EEPROM cell, both the erase and the program operations use the tunnel oxide window 103 to transfer the electron charge. In addition, this electron charge is transferred to and from the floating gate 105 and the drain diffusion 109. However, this prior art EEPROM has several serious drawbacks.

First, the prior art cell requires an extremely high voltage be applied to the bit line 106 as well as to the drain diffusion 109 during erase and program operations. This high voltage requirement limits the scalability of the memory cells. The large drain voltage requires a deep diffusion junction to provide adequate reverse bias breakdown voltage between the junction and the substrate. In addition, large spaces must be provided between the diffusion regions and the adjacent bit lines to prevent the high voltage from causing a field oxide punch through. Finally, the channel length of the selection transistor must be kept large to prevent a channel punch through. As a result, the conventional EEPROM device cannot be readily scaled down. As a further result, today's EEPROM technology is far behind the most advanced Flash memory technology that typically requires lower erase and program voltages. Because of the necessarily large cell size of the EEPROM, most EEPROM-based products are limited to the low density market such as the 512 Kb memory.

Second, the conventional EEPROM memory cell requires complex processing steps to manufacture. At least three different n-type ion implantations must be used to generate the required diffusions for the N− tunneling window 109, the lightly doped source 110, and the heavily doped drain and source regions 107, 108, and 111. Further, at least two additional deposition and etching sequences must be added to the process flow to create the tunnel oxide window 103 and the thicker gate oxide layer 113 under the floating gate 105. Compared with a conventional Flash memory cell, the conventional EEPROM memory cell is more difficult and expensive to manufacture and has a lower yield.

Third, the complex topology of the conventional EEPROM cell also creates many problems and difficulties in aligning the process steps. Particularly, the tunnel oxide window 103 and the drain diffusion 109 create problems. Since the drain diffusion 109 must sustain a high voltage, it is very important that the entire tunnel oxide window 103 be located inside the region defined by the underlying drain diffusion 109. This will result in optimum diffusion to substrate breakdown voltage. However, if a mask misalignment occurs, the tunnel oxide window 103 may extend beyond the diffusion region 109 and cause the edge of the drain diffusion 109 to be exposed under the tunnel oxide window 103. This occurrence will result in a lowered diffusion 109 to substrate 112 breakdown voltage. Under certain operating conditions, the high voltage supplies of the device may not be able to sustain the resulting leakage current and the erase and program operations may fail. In addition, the diffusion region must extend under the field oxide region (not shown) between adjacent bit lines to avoid exposing the diffusion edge under the tunnel oxide window in the edge of the field oxide. Therefore, the diffusion region has to be extended about 0.5 microns beyond the field oxide edge according to a 2 microns process described in the prior art.

From the above description of the conventional EEPROM cell, many disadvantages have been described. The large erasing and programming voltages and the complex cell structure create problems and difficulties for scaling down the technology. As a result a novel EEPROM cell and array structure has been achieved to reduce the operational voltages, reduce the cell complexity, and to improve the scalability.

SUMMARY OF THE INVENTION

A principal object of the present invention is to provide an EEPROM cell for use in an integrated circuit memory array.

A further object of the present invention is to provide an EEPROM cell that is highly scaleable, is easy to manufacture, and has high write/erase endurance.

Another further object of the present invention is to provide an EEPROM cell using a Flash memory in series with a selection transistor and an isolation transistor such that scalability, manufacturability, and endurance are improved.

Another further object of the present invention is to provide an EEPROM cell that is compatible with different device types wherein the cell transistors may be NMOS, PMOS, and constructed with or without an isolation well.

Another further object of the present invention is to provide an EEPROM cell that can be byte erased and bit programmed.

Another further object of the present invention is to provide an EEPROM cell that eliminates hot carrier effects by eliminating large voltages in the diffusion junction.

Another object of the present invention is to provide an array architecture using an EEPROM cell.

Another further object of the present invention is to provide an array architecture that facilitates byte erase and bit program with minimal disturb of unselected cells.

Another yet further object of the present invention is to provide an array architecture that can handle switching large voltages to the control gate of the EEPROM cells while not creating hot carrier effects.

In accordance with the objects of the present invention, an EEPROM cell device on a substrate is achieved. The device comprises, first, a selection transistor having gate, drain, source, and channel. The drain is defined as a cell bit line. An isolation transistor has gate, drain, source, and channel. The source is defined as a cell source line. Finally, a floating gate transistor has control gate, floating gate, drain, source, and channel. The drains and sources of each transistor comprise a diffusion layer in the substrate. The channels of each transistor comprise the substrate. The floating gate transistor drain is coupled to the selection transistor source. The floating gate transistor source is coupled to the isolation transistor drain. The device is programmed and erased by charge tunneling between the floating gate and the floating gate transistor channel. The device may further comprise an isolation well underlying the diffusion layer.

Also in accordance with the objects of the present invention, an EEPROM cell device on a substrate is achieved. The device comprises, first, an isolation transistor having gate, drain, source, and channel. The source is defined as a cell source line. Second, a floating gate transistor has control gate, floating gate, drain, source, and channel. The drains and sources of each transistor comprise a diffusion layer in the substrate. The channels of each transistor comprise the substrate. The floating gate transistor drain is defined as a cell bit line. The floating gate transistor source is coupled to the isolation transistor drain. The device is programmed and erased by charge tunneling between the floating gate and the floating gate transistor channel. The device may further comprise an isolation well underlying the diffusion layer.

Also in accordance with the objects of the present invention, an EEPROM array device on a substrate is achieved. The array device comprises a plurality of bytes with each byte further comprising a plurality of cells. Each cell comprises, first, a selection transistor having gate, drain, source, and channel. The drain is defined as a cell bit line. The gate is coupled to the gate of all the cells in the byte to form a byte selection gate line. An isolation transistor has gate, drain, source, and channel. The source is defined as a cell source line. The cell source line is coupled to the cell source line of all the cells in the byte to form a byte source line. The gate is coupled to the gate of all the cells in the byte to form a byte isolation gate line. Finally, a floating gate transistor has control gate, floating gate, drain, source, and channel. The drains and sources of each transistor comprise a diffusion layer in the substrate. The channels of each transistor comprise the substrate. The floating gate transistor drain is coupled to the selection transistor source. The floating gate transistor source is coupled to the isolation transistor drain. The device is programmed and erased by charge tunneling between the floating gate and the floating gate transistor channel. The control gate is coupled to the control gate of all the cells of the byte to form a byte wordline. Finally, a wordline transistor has gate, drain, source, and channel. The gate is coupled to a y selection line. The source is coupled to an x selection line. The drain is coupled to the byte wordline. The channel is coupled to a well voltage line to prevent forward bias of the drain and source to the channel. The device may further comprise an isolation well underlying the diffusion layer. The wordline transistor may comprise a PMOS or an NMOS device in an isolation well. Further, a compliment wordline transistor may be included with gate and source coupled to signals inverted from the x selection and y selection signals.

Also in accordance with the objects of the present invention, an EEPROM array device on a substrate is achieved. The array device comprises a plurality of bytes with each byte further comprising a plurality of cells. Each cell comprises, first, an isolation transistor having gate, drain, source, and channel. The source is defined as a cell source line. The cell source line is coupled to the cell source line of all the cells in the byte to form a byte source line. The gate is coupled to the gate of all the cells in the byte to form a byte isolation gate line. Finally, a floating gate transistor has control gate, floating gate, drain, source, and channel. The drains and sources of each transistor comprise a diffusion layer in the substrate. The channels of each transistor comprise the substrate. The floating gate transistor drain is defined as the cell bit line. The floating gate transistor source is coupled to the isolation transistor drain. The device is programmed and erased by charge tunneling between the floating gate and the floating gate transistor channel. The control gate is coupled to the control gate of all the cells of the byte to form a byte wordline. Finally, a wordline transistor has gate, drain, source, and channel. The gate is coupled to a y selection line. The source is coupled to an x selection line. The drain is coupled to the byte wordline. The channel is coupled to a well voltage line to prevent forward bias of the drain and source to the channel. The device may further comprise an isolation well underlying the diffusion layer. The wordline transistor may comprise a PMOS or an NMOS device in an isolation well. Further, a compliment wordline transistor may be included with gate and source coupled to signals inverted from the x selection and y selection signals.

BRIEF DESCRIPTION OF THE DRAWINGS

In the accompanying drawings forming a material part of this description, there is shown:

FIG. 2 illustrates a first embodiment of the present invention using a selection transistor and an isolation transistor in the EEPROM cell.

FIG. 3A illustrates the erase condition of the selected and deselected memory cell of the first embodiment of the present invention.

FIG. 3B illustrates the program condition of the selected and deselected memory cell of the first embodiment of the present invention.

FIG. 3C illustrates the read condition of the selected memory cell of the first embodiment of the present invention.

DESCRIPTION OF THE PREFERRED EMBODIMENTS

Figure 1:
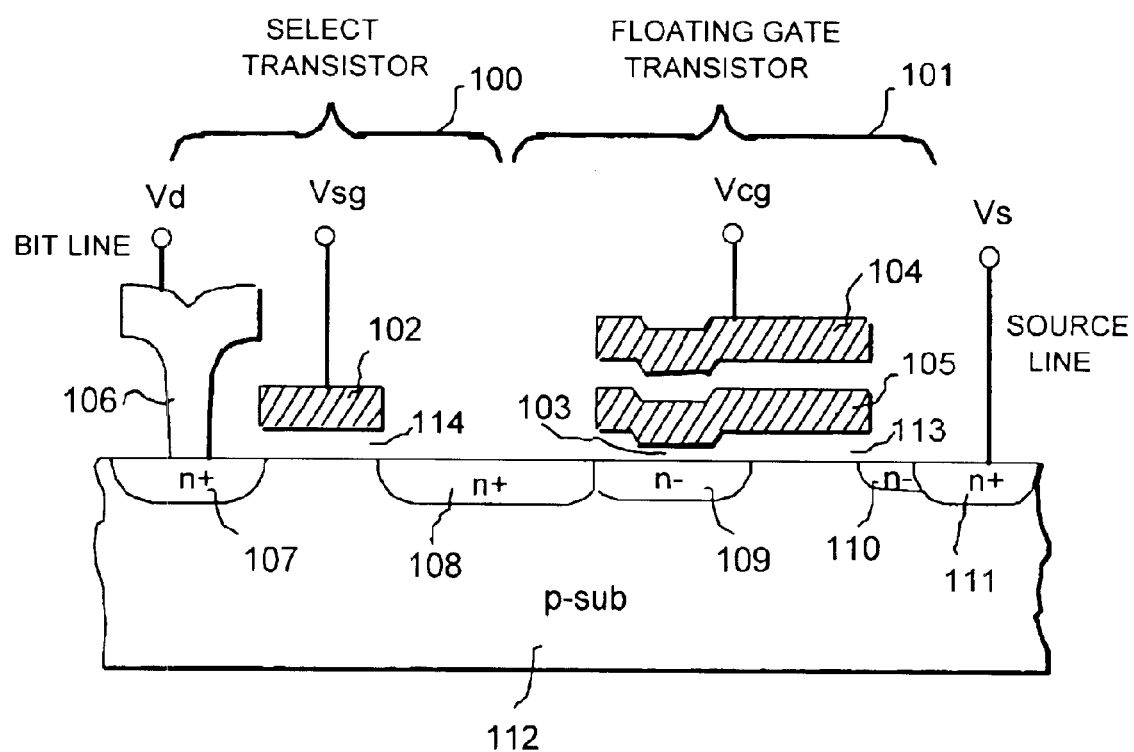
FIG. 1 illustrates a prior art conventional EEPROM cell.

The present invention essentially provides a novel EEPROM cell structure that is highly scalable, easy to manufacture, and provides high endurance. The preferred embodiments disclose the EEPROM cell structure and array architecture. The detailed description and drawings of the invention are given for better clarification and demonstration of the invention, not to intentionally confine the scope of the invention. It should be clear to those experienced in the art that the present invention can be applied and extended without deviating from the scope of the present invention.

Referring now to FIG. 2, a first embodiment of the EEPROM cell of the present invention is illustrated. Several important features of the present invention are illustrated. The memory cell unit comprises three transistors: the selection transistor 200, the floating gate transistor 201, and the isolation transistor 202. The selection transistor 200 has gate 203, drain 212, source 213, and channel. The drain 212 is defined as a cell bit line. The isolation transistor 202 has gate 206, drain 214, source 215, and channel. The source 215 is defined as a cell source line. The floating gate transistor 201 has control gate 204, floating gate 205, drain 213, source 214, and channel. The drains and sources of each transistor comprise a diffusion layer in the substrate. In this embodiment, a single, patterned n+ diffusion layer is be formed in the p-type substrate 216 to create the drain and source regions 212, 213, 214, and 215, of the three transistors. The channels of each transistor comprise the substrate 216. The floating gate transistor 201 drain 213 is coupled to the selection transistor 200 source 213. Further, a common diffusion region 213 is used. The floating gate transistor 201 source 214 is coupled to the isolation transistor 202 drain 214. Further, a common diffusion region 214 is used. The device is programmed and erased by charge tunneling between the floating gate 209 and the floating gate transistor channel 216.

Referring again to FIG. 2, the floating gate transistor 201 is a simple Flash memory cell comprising a polysilicon control gate 204 and a polysilicon floating gate 205 stacked together. The floating gate transistor 201 stores the data on its floating gate 205. The selection transistor 200 isolates the high voltage from the bit line 211 to prevent disturb conditions. The isolation transistor 206 is used to isolate the source diffusion region 214 of the memory cell from the source line ground 215. Note that, in the structure of the present invention, the floating gate transistor 201 is exactly a stacked gate Flash memory cell. This is advantageous to the present invention because of the cell's simple structure that provides high yield, good scalability, and smaller cell size.

The first preferred embodiment of the present invention uses three transistors in series. However, it is still much smaller than the prior art EEPROM cell that only required two transistors. This is because the cell structure of the present invention is much simpler and easier to scale down. As a result, the EEPROM of the present invention can become much smaller than the prior art cell.

Figure 10A:
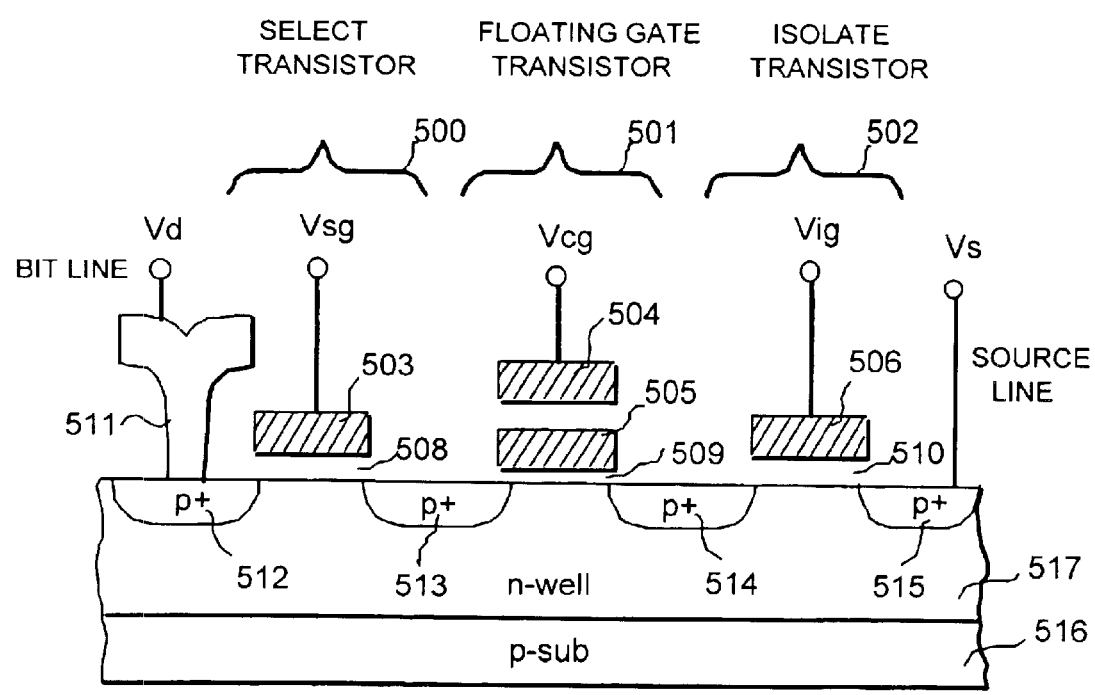
FIG. 10A illustrates the first embodiment EEPROM cell formed in an isolation well.

Referring now to FIG. 10A, an alternative version of the first embodiment EEPROM cell formed in an isolation well is illustrated. An isolation well 517 underlies the diffusion regions 512, 513, 514, and 515. In this version, the cell transistors comprise PMOS transistors.

Referring now to FIG. 3A, the erasing operation conditions for the first embodiment of the present invention are illustrated. These operating condition descriptions for erasing, as well as those shown in FIGS. 3B and 3C for programming and reading, are shown for the NMOS transistor-based embodiment of FIG. 2. It will be understood by those skilled in the art that the same operations may be performed on the PMOS version of FIG. 10A with modification of the polarities of voltages.

Referring again to FIG. 3A, the erasing method comprises, first, forcing the substrate 216 to ground. The selection transistor 200 is turned OFF by biasing the selection gate (Vsg) 203 to ground. Turning OFF the selection transistor 200 isolates the floating gate transistor 201 from the cell bit line 211. The isolation transistor 202 is turned OFF by biasing the isolation gate 206 to ground. Turning OFF the isolation transistor 202 isolates the floating gate transistor 201 from the cell source line 215. Finally, the floating gate transistor control gate 204 is forced to a tunneling voltage of about −10 Volts to thereby cause tunneling between the floating gate 205 and the floating gate transistor channel 217.

The tunneling voltage is a negative voltage with respect to the substrate 216 that is large enough to build an electric field across the tunnel oxide 209 sufficient to overcome the energy barrier for tunneling. The control gate 204 is applied with the negative voltage. The channel region 217, which is part of the substrate 216 underlying the floating gate 205, has the same potential as the substrate 216, that is, ground. Therefore, the high electric field will inject electron charge from the floating gate 205 to the channel region 217. This causes the electron charge in the floating gate 205 to decrease and thus decreases the threshold voltage of the floating gate transistor 201 of the memory cell.

If the memory cell is not selected for erasing, the control gate 204 is grounded to thereby create a zero potential difference between the floating gate 205 and the channel region 217. This circumstance will prevent any voltage disturbance of the data stored on the deselected cell. As it is obvious that the erase operation is selected by the bias of the control gate 204, the memory array should be constructed such that the large negative voltage for the selected cells can be decoded and applied to selected bytes in the array. Details of preferred array configurations will be disclosed below.

It is important to note that, during an erase operation, both the selection transistor 200 and the isolation transistor 202 are turned OFF by grounding their gates. This approach causes the diffusion regions that form the drain 213 and source 214 of the floating gate transistor 201 to be floating. The potential for the hot carrier effect to occur is greatly reduced by this action. Cell reliability is thereby improved.

Referring now to FIG. 3B, the program condition of the selected memory cell of the first embodiment of the present invention is shown. The programming method comprises, first, forcing the substrate 216 to ground. The cell bit line 211 is forced to ground for the selected cell. The selection transistor 200 is turned ON biasing Vsg with a positive voltage of about 7 Volts to couple the cell bit line 211 to the floating gate transistor drain 213. The isolation transistor 202 is turned OFF to isolate the floating gate transistor source 214 from the cell source line 215. The floating gate transistor control gate 204 is forced to a tunneling voltage of about +10 Volts to cause tunneling between the floating gate 205 and the floating gate transistor channel 217.

As the erase operation of the disclosed EEPROM cell decreased a selected cell's threshold voltage, the program operation is utilized to increase a selected cell's threshold voltage. To program a selected cell, the control gate 204 of the selected cell is driven to a positive high voltage of, for example, about +10 Volts. Meanwhile, the channel region 217 is grounded. If the positive voltage is sufficiently large, the electric field across the tunnel oxide 209 will overcome the tunneling barrier and cause electron charge to inject from the channel region 217 to the floating gate 205. This will cause the charge stored in the floating gate 205 to increase and thus results in a higher voltage threshold for the floating gate transistor 201.

In the erase operation, the control gates of all the cells in the selected byte are tied together. However, in the programming operation, bits may be individually selected. Therefore, a sufficient positive voltage, called an inhibit voltage, is applied to the channel region of deselected cells in the selected byte to prevent them from being programmed. These channel region 217 voltages are applied to the selected and deselected cells from the cell bit lines 211. The selected cell bit line is forced to ground. The deselected cell bit line is forced to an inhibit voltage of about +5 Volts. The selection transistor 200 is turned ON to pass the bit line voltages to the drain diffusion 213 of the memory cells. As the control gates 204 of the cells in the selected byte are applied with the programming voltage, the channel region 217 of both selected and deselected memory cells is turned ON to pass the bit line voltage to the channel region 217. Therefore, the selected cell will inject electron charge from floating gate 205 to channel 217 since the voltage across the tunnel oxide 209 is the full programming voltage, or about +10 Volts. The deselected cell will not exhibit charge injection since the voltage across the tunnel oxide is only the programming voltage minus the inhibit voltage or about +5 Volts. The electric field is insufficient to overcome the barrier. During the programming operation, the isolation transistor 202 is shut OFF to prevent current flow between the channel region 217 and the common source bit line 215.

Referring now to FIG. 3C, the read operation conditions are illustrated for the first embodiment of the present invention. During the read operation, the gates of the selection transistor 200, the floating gate transistor 201, and the isolation transistor 202 are all applied with a bias of VDD. If the threshold voltage of the floating gate transistor 201 is lower than VDD, then the floating gate transistor channel 217 will be turned ON and current will be able to flow from the bit line 211 to the source line 215 through the three transistors of the EEPROM cell. However, if the floating gate transistor 201 threshold voltage is higher than VDD, then the floating gate transistor 201 channel will be OFF and current will not be able to flow from the bit line 211 to the source line 215. To minimize the disturbance caused by the bit line voltage 211, the bit line 211 is typically limited to a reading voltage of less than about 1 Volt. A sense amplifier circuit is coupled to the selected bit line to detect the flowing current on the bit line and to convert it to binary data. Also notice that, the voltages applied to the gates of the selection transistor 200, the floating gate transistor 201, and the isolation transistor 202 can be higher than VDD by using a on-chip boost circuit to achieve faster read speed.

The disclosed EEPROM cell of the invention has two significant improvements over the prior art. From the above description, both the erase and the program operations are performed by transferring electron charge directly between the channel region 217 and the floating gate 205. This is known as both 'channel erase' and 'channel program' operation. It is known in the art that this type of operation has the following beneficial characteristics.

First, the invention has significantly higher scalability. Because the voltage required to be applied to the drain diffusion of the memory cell for erase and program operations is greatly reduced from approximately +10 Volts to about +5 Volts, the breakdown voltage requirement of the diffusion junction is greatly reduced. As a result, the depth and spacing of the diffusion region become highly shrinkable. Further, the junction doping concentration can be optimized. The memory cell then becomes much more scalable than the prior art cell.

Second, the invention significantly improves the endurance cycling capability. Because the electron charge is directly injected between the floating gate and the channel region, no junction is involved in the erase or program operation. Other Flash or EEPROM technologies use 'drain side injection' or 'source side injection.' These methods apply a high voltage to either the drain or the source diffusion and will generate hot carriers and, particularly, hot holes, that will be injected toward the floating gate. These hot holes will become trapped in the tunnel oxide. This phenomenon has been well studied in the art and has been reported as the major cause of degradation of the memory device's endurance characteristic. Alternatively, the invention injects the electron charge directly between the channel region and the floating gate. Therefore, hot carrier injection is eliminated. Consequently, the present invention exhibits a greatly improved endurance characteristic.

Third, the invention significantly reduces the supply current requirements for the erase and program operations compared to the prior art 'drain side' or 'source side' injection devices. The prior art generally requires the application of a high voltage on the drain or source diffusion while the cell channel is OFF. Therefore, a large voltage differential exists across the diffusion to substrate junction. This voltage will cause a phenomenon known in the art as 'band-to-band tunneling.' The band-to-band tunneling effect creates a leakage path of the current applied to the diffusion region to leak to the substrate. The current level is approximately in the 10 nA to 100 nA range per cell. If the typical page size of the memory is about 1,024 cells, this leakage translates to a current of about 100 $\mu$A for a page erase. The present invention eliminates this problem by not applying a large voltage to the diffusion regions in the substrate. The supply current for the high voltage to the diffusion region will be significantly reduced to approximately 10 pA per cell. The high voltage supply current requirement can therefore be reduced about three to four orders of magnitude over the prior art.

Figure 4:
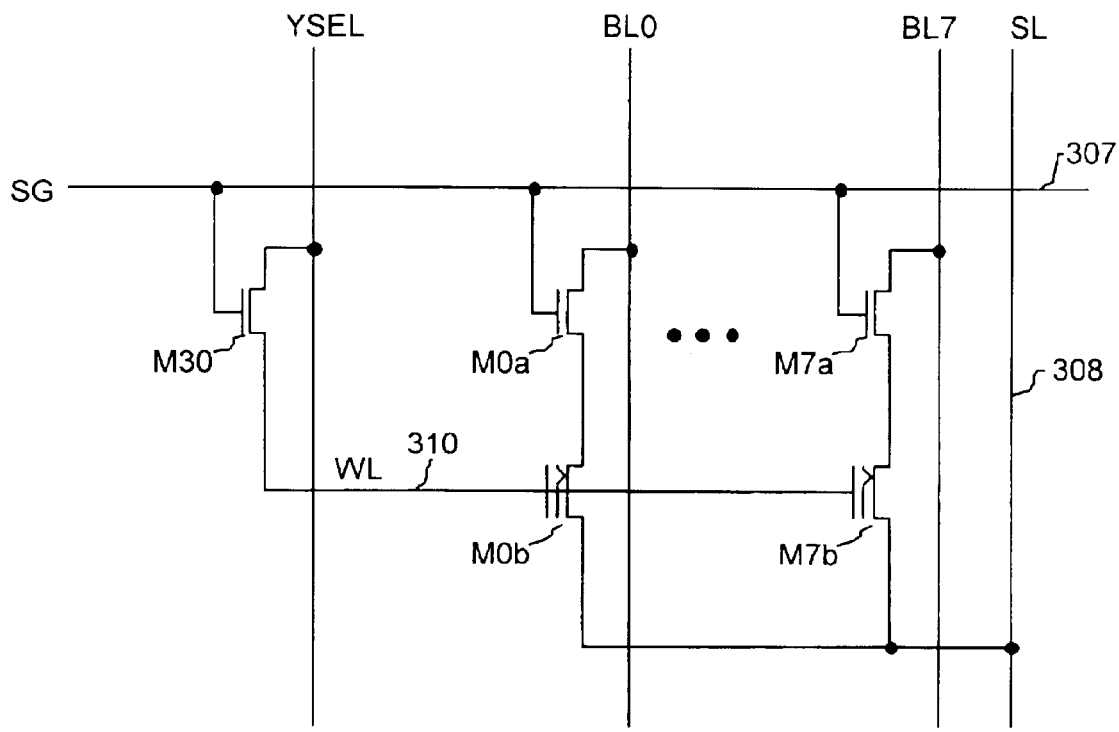
FIG. 4 illustrates the prior art array architecture of the conventional EEPROM.

Referring now to FIG. 4, a prior art array architecture using the prior art EEPROM cell is shown. As the EEPROM product requires a byte-based erase and program capability, the memory array is partitioned as a plurality of single byte units. The single byte units are typically 8 bit cells in size. In this case, the byte comprises the EEPROM transistors M0b through M7b. The control gates of the cells in a single byte are coupled together to form a common word line WL 310. This word line 310 is decoded by the selection gate line SG 307 and the y selection line YSEL 320. The operational table for the prior art array is given in Table 2.

TABLE 2

Operation Conditions for Prior Art EEPROM Array.

| Operation | | SG | YSEL | WL | BL0–BL7 | SL |
|---|---|---|---|---|---|---|
| Erase | Selected | >= +12 V | +12 V | +12 V | 0 V or FL | 0 V |
|  | Deselected | 0 V | 0 V | 0 V | 0 V or FL | 0 V |
| Program | Selected | >= +12 V | 0 V | 0 V | +12 V | 0 V |
|  | Deselected | 0 V | 0 V | 0 V | 0 V | 0 V |
| Read | Selected | VDD | VDD | VDD − Vt | ι + 1 V | 0 V |
|  | Deselected | 0 V | 0 V | 0 V | 0 V or FL | 0 V |

Note that, because the word line transistor M30 is an NMOS device, it cannot provide a negative voltage to the word line 310. This is because the NMOS is directly formed on the p-type substrate that is coupled to ground. If a negative voltage is applied to YSEL 320, this will cause a forward bias current to flow from the p-substrate to the n+ diffusion of the NMOS device M30.

Figure 5:
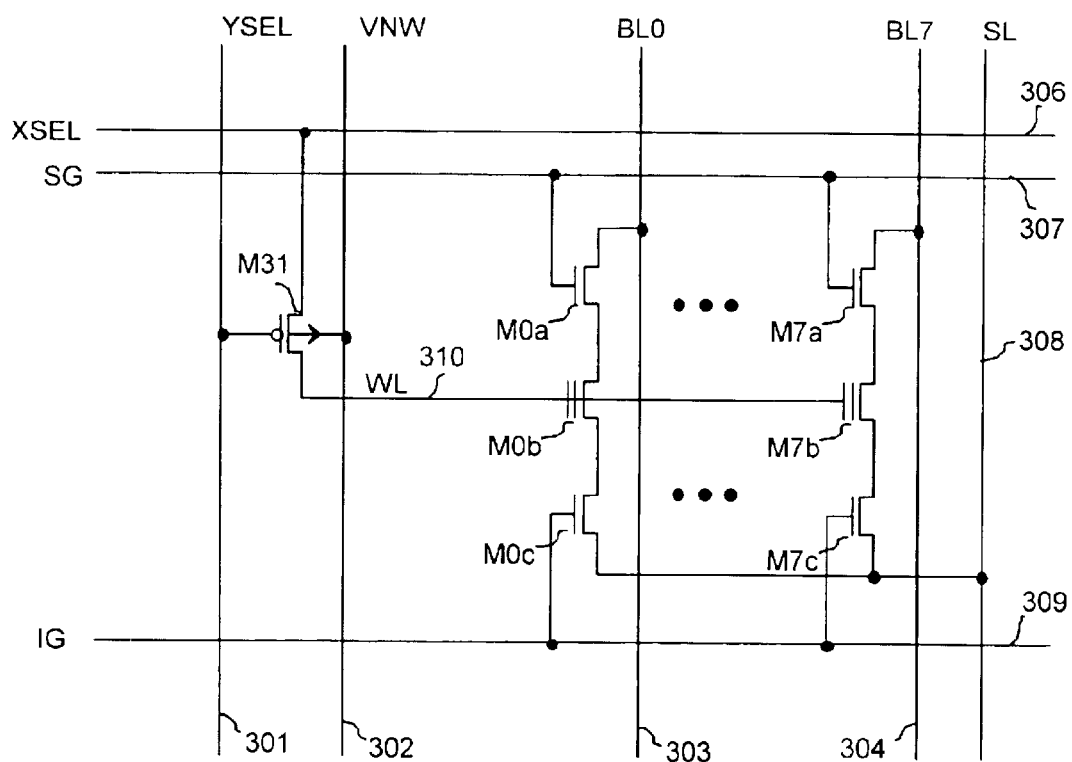
FIG. 5 illustrates a first embodiment of the array architecture of the present invention using the first embodiment of the EEPROM cell with a single, PMOS wordline transistor.

Referring now to FIG. 5, a first embodiment of the array architecture using the first embodiment of the EEPROM cell of the present invention is illustrated. In this embodiment, a single, PMOS wordline transistor is used for each byte of the array. The array comprises a plurality of bytes of cells. Each byte of cells is preferably a group of eight cells. Each cell comprises, first, a selection transistor M0a having gate, drain, source, and channel. The drain is defined as a cell bit line BL0. The gate is coupled to the gate of all the cells in the byte to form a byte selection gate line SG 307. An isolation transistor M0c has a gate, drain, source, and channel. The source is defined as a cell source line. The cell source line is coupled to the cell source line of all the cells in the byte to form a byte source line SL 308. The gate is coupled to the gate of all the cells in the byte to form a byte isolation gate line IG 309. Finally, a floating gate transistor M0c has control gate, floating gate, drain, source, and channel. The drains and sources of each transistor M0a, M0b, and M0c, comprise a diffusion layer in the substrate. The channels of each transistor comprise the substrate. The floating gate transistor M0b drain is coupled to the selection transistor M0a source. The floating gate transistor M0b source is coupled to the isolation transistor M0c drain. The device is programmed and erased by charge tunneling between the floating gate and the floating gate transistor M0b channel. The control gate is coupled to the control gate of all the cells of the byte to form a byte wordline WL 310.

A wordline transistor M31 has gate, drain, source, and channel. The gate is coupled to a y selection line YSEL 301. The source is coupled to an x selection line XSEL 306. The drain is coupled to the byte wordline WL 310. The channel is coupled to a well voltage line VNW 302 to prevent forward bias of the drain and source to the channel. The wordline transistor M31 preferably comprises a PMOS transistor in this embodiment, but may comprise a NMOS transistor in an isolation well as shown in a later embodiment. Further, a compliment wordline transistor may be included with gate and source coupled to signals inverted from the x selection and y selection signals as shown in the second embodiment.

The operating conditions table for the first embodiment array architecture using the first embodiment EEPROM cell is shown as Table 3 below.

share some lines with an adjacent byte in either the row or the column direction. For these types of deselected bytes, the lines that are shared between the selected and deselected

TABLE 3

Operation Conditions for First Array Architecture using First EEPROM Cell Embodiment.

| Oper. |   | XSEL  | YSEL     | VNW   | SG      | IG    | WL    | BL0–BL7  | SL      |
|-------|---|-------|----------|-------|---------|-------|-------|----------|---------|
| Erase | S | -10 V | <= -10 V | 0 V   | 0 V     | 0 V   | -10 V | 0 V/FL   | 0 V/FL  |
|       | D | 0 V   | 0 V      | 0 V   | 0 V     | 0 V   | FL    | 0 V/FL   | 0 V/FL  |
| Prog. | S | +10 V | 0 V      | +10 V | >= +5 V | 0 V   | +10 V | 0 V/5 V  | 0 V/FL  |
|       | D | 0 V   | +10 V    | +10 V | 0 V     | 0 V   | FL    | 0 V/FL   | 0 V/FL  |
| Read  | S | VDD   | 0 V      | VDD   | VDD     | VDD   | VDD   | ι + 1 V  | 0 V     |
|       | D | 0 V   | VDD      | VDD   | 0 V     | 0 V   | FL    | 0 V/FL   | 0 V/FL  |

According to the bias condition of the invention for the erase operation, the wordline 310 of the selected byte has to be forced to a large negative voltage, called a tunneling voltage, of about −10 Volts during the erase operation. A large positive tunneling voltage of about +10 Volts must be applied to the wordline during a program. As described in the prior art discussion regarding FIG. 4 above, the NMOS wordline transistor is not suitable to this task due to the inability of switching a negative voltage. To provide a large negative voltage with respect to the substrate, the first embodiment array architecture of the present invention uses a PMOS transistor M31 as the wordline transistor for cells M0*b* through M7*b*.

During an erase operation, the substrate is maintained at ground. The selection transistors M0*a*–M7*a* of the selected byte are turned OFF to thereby isolate the floating gate transistors M0*b*–M7*b* from the cell bit lines BL0–BL7. The isolation transistors M0*c*–M7*c* of the selected byte are turned OFF to thereby isolate the floating gate transistors M0*b*–M7*b* from the byte source line SL 308. The x selection line XSEL 306 of the selected byte is forced to a tunneling voltage that is a large negative voltage of preferably about −10 Volts. The byte wordline transistor M31 of the selected byte is turned ON to force the byte wordline WL 310 to the tunneling voltage and to thereby cause tunneling between the floating gates M0*b*–M07 and the floating gate transistor channels.

Note that the YSEL line 301 is forced to a large negative voltage of less than or equal to the XSEL voltage to turn ON M31. M31 passes the XSEL voltage to the byte wordline WL 310 of the selected byte. The PMOS transistor M31 is formed in a n-well region in the substrate. This n-well is biased by the VNW line 302. During an erase operation, the VNW signal 302 is biased to voltage that is higher than the negative XSEL voltage so that no diffusion junctions are forward biased.

Meanwhile, both the selection gate line SG 307 and the isolation gate line IG 309 of the eight selected cells are grounded to float the drain and source regions of the selected cells M0*b*–M7*b*. In this case, the eight bit lines, BL0–BL7, and the source line SL 308 may be either grounded or floating. Consequently, the eight cells, M0*b*–M7*b*, are biased to the erase condition as illustrated above in FIG. 3A. Moreover, the erase conditions for the deselected cells are also shown in Table 3 above. However, in order to prevent any confusion regarding Table 3, the bias conditions shown for a deselected byte (D) assumes that the deselected byte does not share any line with the selected (S) byte. In a real array configuration, however, the selected byte will likely bytes will be applied with the same bias condition as shown for the selected byte. Otherwise, for those lines that are not shared with the selected byte, the deselected bias condition will be applied to the line as shown in the table.

During a program operation, the programming is on a bit-by-bit basis within a selected byte. Therefore, a selected cell of a selected byte is programmed while an unselected cell of the selected byte is inhibited from programming. The method comprises, first, maintaining the substrate at ground. The selection transistors M0*a*–M7*a* of the selected byte are turned ON by the SG signal 307 to thereby couple the floating gate transistors M0*b*–M7*b* to the cell bit lines. The isolation transistors M0*c*–M7*c* of the selected byte are turned OFF by the IG signal 309 to thereby isolate the floating gate transistors M0*b*–M7*b* from the byte source line SL 308. The XSEL line 306 is forced to a tunneling voltage. The cell bit line, for example, BL0 303, of the selected cell is forced to ground. The cell bit line, for example, BL7 304, of the unselected cell is forced to an inhibit voltage. The wordline transistor M31 of the selected byte is turned ON to force the byte wordline WL 310 to the tunneling voltage and to thereby cause tunneling between the selected cell (M0*b*) floating gate and the selected cell floating gate transistor channel. However, the presence of the inhibit voltage at the unselected cell M7*b* drain prevents tunneling in the unselected cell.

Note that the XSEL line 306 is forced to a large positive voltage, and the YSEL line 301 must be forced to a voltage of equal to or greater value to insure that M31 is ON. In addition, the n-well of the PMOS transistor M31 must be biased by VNW to a positive voltage of equal to or higher than XSEL to prevent a forward biased junction. The bit lines BL0–BL7 are forced to two different voltages depending on the programmed data. If a cell is to be programmed, the bit line is forced to a relatively low voltage, and preferably ground. If a cell is not to be programmed, then the bit line is forced to an inhibit voltage that is a relatively large, positive value, and, more preferably, is about 5 Volts. The select gate line SG 307 is forced to a positive high voltage of equal to or greater than the inhibit voltage in order to guarantee turn ON of all the selection transistors of the eight cells. The isolation gate line IG is forced to ground to shut OFF all the isolation transistors M0*c*–M7*c* in the byte. This prevents current flow from the deselected cells to the selected cells through the common source line SL 308. As a result, the programming conditions of FIG. 3B are realized.

Referring now again to FIG. 5, the read operation is performed by forcing the wordline WL 310, the selection gate line SG 307, and the isolation gate line IG 309 to a relatively large positive voltage, and, more preferably, to VDD. The source line SL 308 is forced to a low voltage, and modification allows both the selected wordline WL 310 and the deselected wordline to receive different driven voltages.

TABLE 4

Operating Conditions for Second Embodiment Array Architecture including Complimentary PMOS Transistor.

| OP | | XSEL1 | XSEL2 | YSEL1 | YSEL2 | VNW | SG | IG | WL | BL0–BL7 | SL |
|----|---|-------|-------|-------|-------|-----|----|----|----|---------|-----|
| E | S | −10 V | 0 V | [−10 V | 0 V | 0 V | 0 V | 0 V | −10 V | 0 V/FL | 0 V/FL |
| | D | 0 V | 0 V | 0 V | [−10 V | 0 V | 0 V | 0 V | FL | 0 V/FL | 0 V/FL |
| P | S | +10 V | 0 V | 0 V | +10 V | +10 V | $\mu$ + 5 V | 0 V | +10 V | 0 V/5 V | 0 V/FL |
| | D | 0 V | 0 V | +10 V | 0 V | +10 V | 0 V | 0 V | $\iota$Vtp | 0 V/FL | 0 V/FL |
| R | S | VDD | 0 V | 0 V | VDD | VDD | VDD | VDD | VDD | $\iota$ + 1 V | 0 V |
| | D | 0 V | 0 V | VDD | 0 V | VDD | 0 V | 0 V | $\iota$Vtp | 0 V/FL | 0 V/FL | more preferably, to ground. The bit lines BL0–BL7 of the selected byte are formed to a low positive voltage of about 1 Volt. Sense amplifiers are connected to the bit lines via bit line decoders. If any of the selected cells M0b-M7b has a low threshold voltage, there will be current flowing from that bit line, and the sense amplifier will detect a logical '1'. If the threshold voltage is high, no current will flow, and the sense amplifier will decode a logical '0'.

Figure 6:
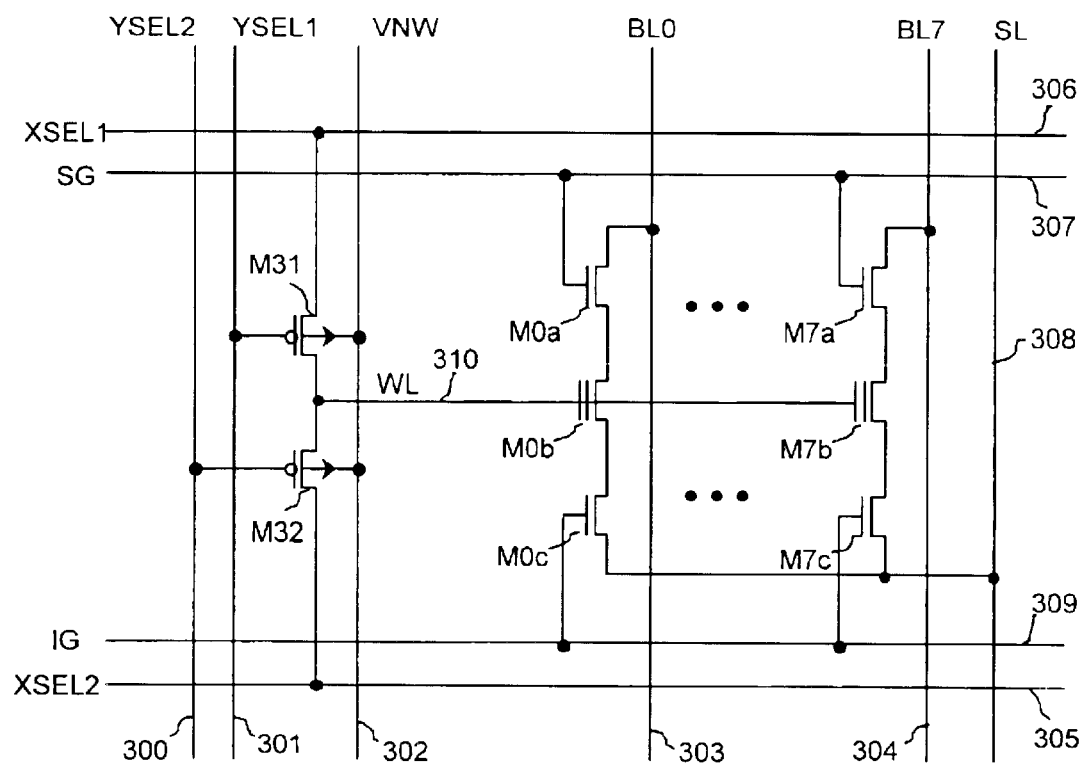
FIG. 6 illustrates a second embodiment of the array architecture of the present invention using the first embodiment of the EEPROM cell with two PMOS wordline transistors.

Referring now to FIG. 6, a second embodiment of the array architecture of the present invention is illustrated. In this embodiment, a complimentary PMOS transistor M32 is added to the single PMOS device M31 of the first embodiment. A potential problem arises with the first embodiment architecture of FIG. 5. Namely, if deselected bytes share the XSEL line 306 with the selected byte, then the wordline transistor M31 of that deselected byte must be turned OFF to prevent the tunneling voltage from passing to the deselected memory cells. However, this results in the wordlines WL 310 of the deselected bytes being floated. This is not preferable because the floated WL 310 nodes in the deselected cells may trap positive or negative high voltage from the erase or program operation and cause the deselected cells to become disturbed or potentially lose data. The other possible problem occurs during programming. During a programming operation, all the n-wells for the selected and deselected bytes are applied with the VNW 302 voltage in order to avoid the forward bias condition. Unfortunately, where the WL 310 nodes are floating due to the above described condition, these WL nodes will gradually become charged to the same potential as the n-wells through junction leakage. This can cause the deselected cells to be disturbed.

Figure 7:
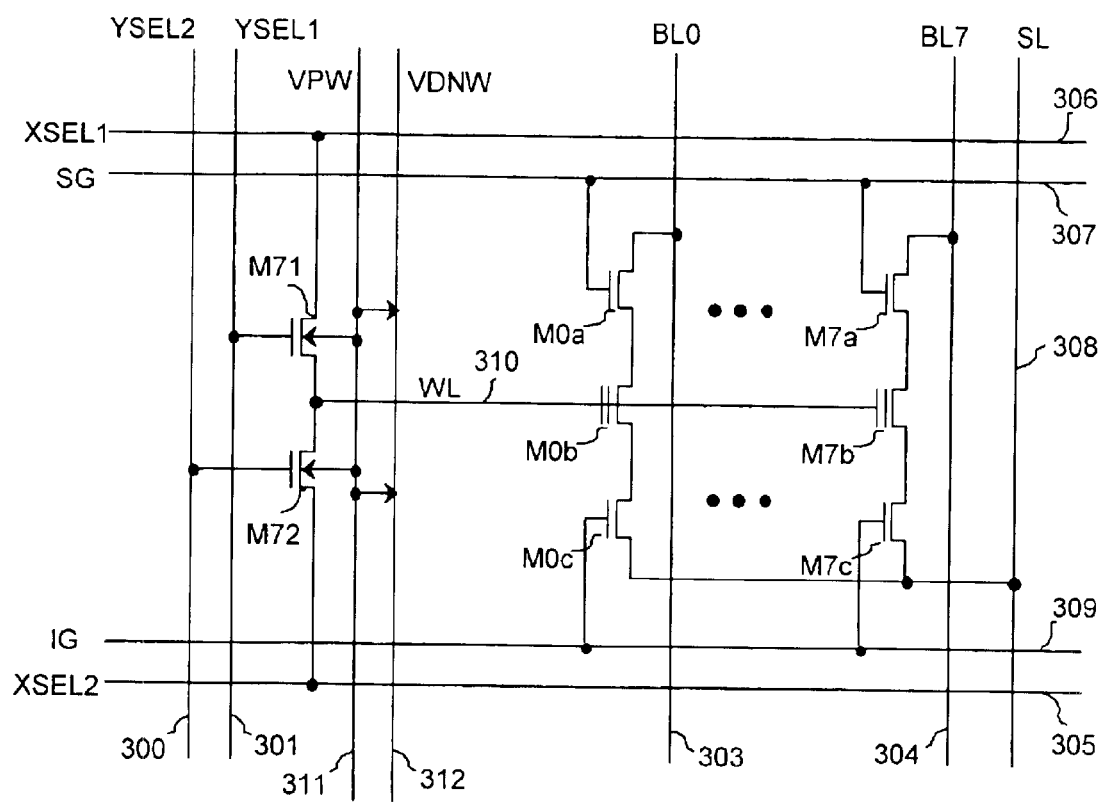
FIG. 7 illustrates a third embodiment of the array architecture of the present invention using the first embodiment of the EEPROM cell with two triple well NMOS wordline transistors.

Referring again to FIG. 6, the second embodiment of the invention addresses the above-described problem by adding an extra PMOS transistor M32 to each byte wordline WL 310. The deselected wordlines will no longer be allowed to float. Instead, these wordlines are positively driven to a complimentary voltage from the XSEL2 line 305. The first PMOS transistor M31 is configured as in the first embodiment and performs the same function. The additional, complimentary PMOS transistor, M32, performs complimentary functions to the those of M32 as can be seen in Table 4 below. When M31 is ON, M32 is OFF. When M31 is OFF, M32 is ON. M32 will pass the voltage of the complimentary XSEL2 line 305 to the deselected wordlines under the control of the complimentary y select line YSEL 300. This Referring now to FIG. 7, a third embodiment array architecture is illustrated. In this embodiment, the PMOS wordline transistors are replaced with two NMOS transistors M71 and M72. As described above, the typical NMOS transistor that is formed in the p-substrate is not capable of sourcing a negative voltage with respect to the substrate because this will cause a forward biasing of the junctions. However, a NMOS transistor formed in a triple-well technology can be used. Triple well technology is well known in the art. In a triple well technology, the NMOS transistor is formed in a separated p-well. This p-well is further formed in a separated n-well, typically referred to as a deep n-well. This deep n-well is formed in the p-substrate. The triple well scheme allows the diffusions of the NMOS transistor to be isolated from the substrate. Further, the p-well and deep n-well can be biased independently to control the operating range of the NMOS transistor.

During an erase operation, the x selection line 1 XSEL1 306 is forced to a tunneling voltage that is a large negative voltage of preferably about −10 Volts. The y selection line 1 YSEL1 301 is biased to a voltage of equal or less than XSEL1 to turn ON M71 and pass the tunneling voltage to the wordline WL 310. Meanwhile, the p-well of the NMOS transistors M71 and M72 is biased to the same large negative voltage as XSEL1 306 to prevent forward biasing. As a result, the NMOS device M71 cased in the triple well technology is capable of providing the negative voltage to the wordline for the erase operation. Moreover, the deep n-well VDNW 312 containing the p-well VPW 311 may be biased to either ground or VDD. The large breakdown voltages of the p-well and deep n-well can easily withstand the voltage.

The other NMOS transistor M72 that is coupled to the wordline WL 310 performs the same function as the M32 PMOS transistor. The M72 transistor performs the complimentary logic for M71. M72 provides a driven voltage level to deselected wordlines during erase, program, and reading operations. The operation conditions are shown in Table 5 below. Note that the second NMOS transistor M72 may be removed to create an arrangement similar to the first embodiment. In this case, the wordline for the deselected bytes will be floating.

TABLE 5

Operating Conditions for Second Embodiment Array Architecture including Complimentary NMOS Transistor.

| OP | | XSEL1 | XSEL2 | YSEL1 | YSEL2 | VPW/ VDNW | SG | IG | WL | BL0– BL7 | SL |
|---|---|---|---|---|---|---|---|---|---|---|---|
| E | S | −10 V | 0 V | 0 V | −10 V | −10 V 0 V | 0 V | 0 V | −10 V | 0 V/ FL | 0 V/ FL |
|   | D | 0 V | 0 V | −10 V | 0 V | −10 V 0 V | 0 V | 0 V | 0 V | 0 V/ FL | 0 V/ FL |
| P | S | +10 V | 0 V | μ + 10 V | 0 V | 0 V VDD | μ + 5 V | 0 V | +10 V | 0 V/ 5 V | 0 V/ FL |
|   | D | 0 V | 0 V | 0 V | μ + 10 V | 0 V VDD | 0 V | 0 V | 0 V | 0 V/ FL | 0 V/ FL |
| R | S | VDD | 0 V | 0 V | VDD | 0 V VDD | VDD | VDD | VDD | ι + 1 V | 0 V |
|   | D | 0 V | 0 V | VDD | 0 V | 0 V VDD | 0 V | 0 V | 0 V | 0 V/ FL | 0 V/ FL |

Figure 8:
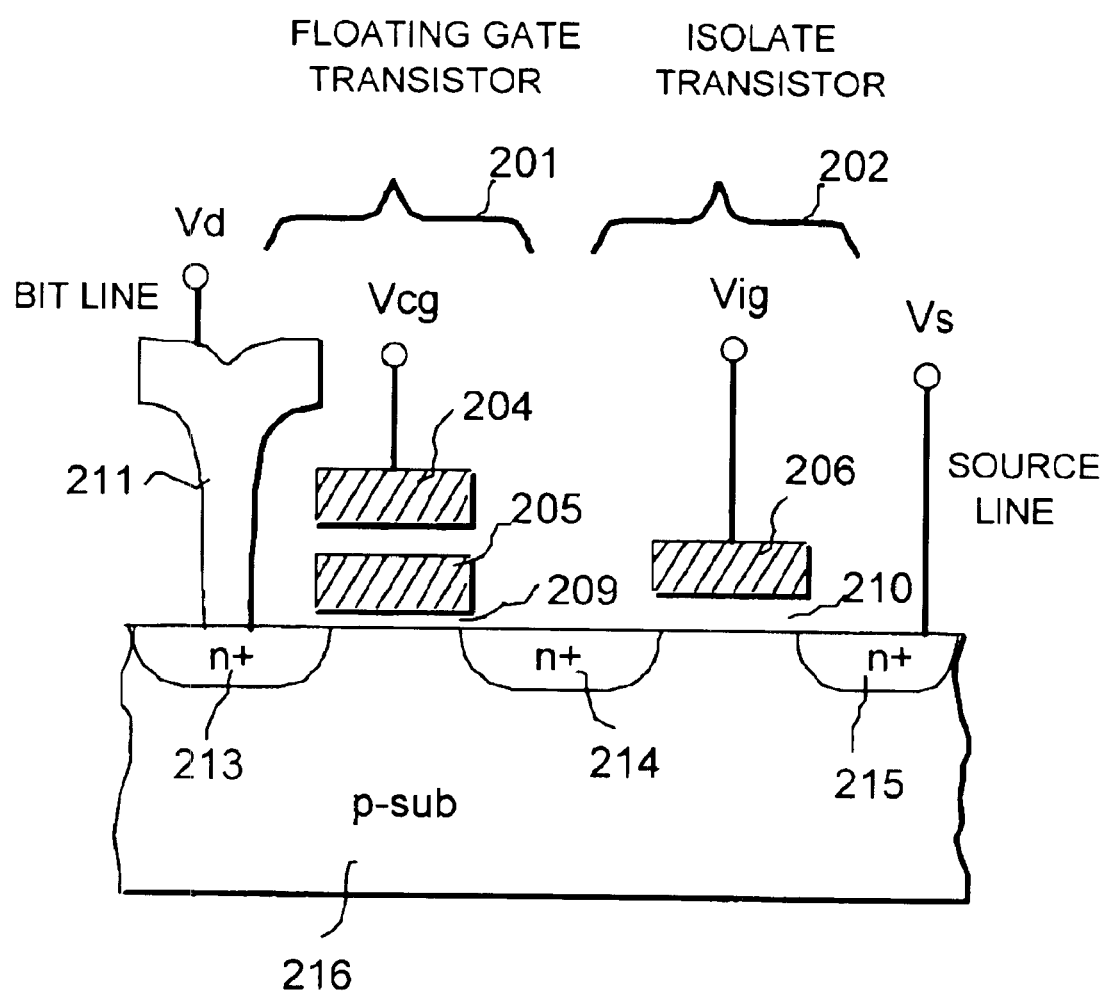
FIG. 8 illustrates a second embodiment of the present invention using only an isolation transistor in the EEPROM cell.

Referring now to FIG. 8, a second embodiment of the EEPROM cell is shown. This EEPROM cell is reduced from three transistors to two. The device comprises, first, an isolation transistor 202 having gate 206, drain 214, source 215, and channel. The source 215 is defined as a cell source line 215. Second, a floating gate transistor 201 has control gate 204, floating gate 205, drain 213, source 214, and channel. The drains and sources of each transistor comprise a diffusion layer 213, 214, and 215, in the substrate 216. The channels of each transistor comprise the substrate 216. The floating gate transistor drain 213 is defined as a cell bit line 211. The floating gate transistor source 214 is coupled to the isolation transistor drain 214. The device is programmed and erased by charge tunneling between the floating gate 205 and the floating gate transistor channel 216.

Figure 10B:
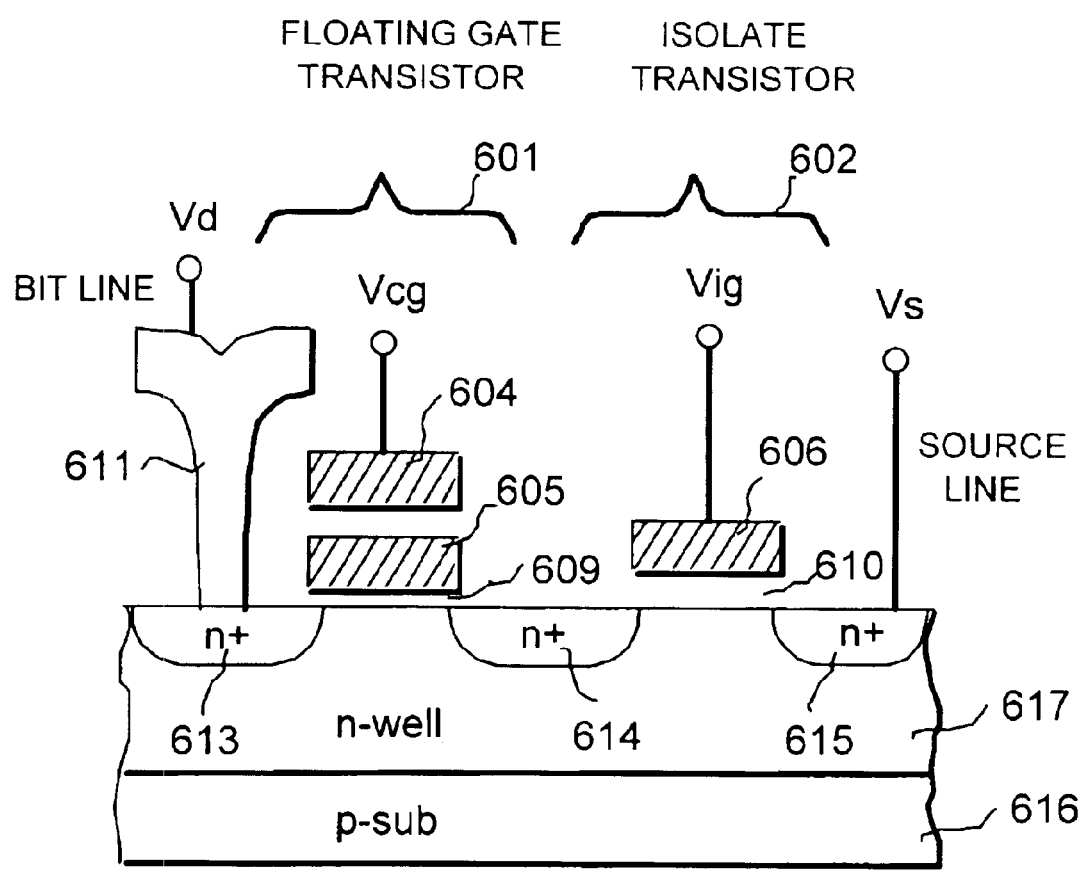
FIG. 10B illustrates the second embodiment EEPROM cell formed in an isolation well.

Referring to FIG. 10B, the device may further comprise an isolation well 617 underlying the diffusion layer 613, 614, and 615. In this case, the transistors 601 and 602 comprise PMOS devices, and the diffusion layer is a p-type layer.

Referring again to FIG. 8, the two transistor EEPROM cell drastically reduces the cell size. However, there are some concerns regarding cell disturbance. These concerns can be resolved however. As a result of eliminating the selection transistor, the floating gate transistor 201 is coupled directly to the bit line 211. Therefore, the floating gate 204 may be disturbed by the voltage applied to the bit line 211 during operations. For example, the bit line 211 for a deselected cell is applied with an inhibit voltage that is a positive value of about 5 Volts during a program operation. However, this bit line voltage is not desirable for other deselected cells that share the same bit line. To eliminate this bit line disturbance, the selection transfer of the first embodiment is turned OFF to isolate the floating gate device.

Without the selection transistor, the floating gate transistor 201 is exposed to this bit line voltage during the program operation and gradually loses electron charge from the floating gate 204. To reduce this bit line disturbance for the two transistor EEPROM cell, the gate of the deselected floating gate transistors 201 is applied with a inhibit positive low or middle voltage, such as +2.5V for example, to reduce the bit line disturbance from the deselected bit line 211. The operating conditions of the two transistor EEPROM cell of the second preferred embodiment are shown in Table 6.

TABLE 6

Operation Conditions for Two Transistor EEPROM Cell of Second Embodiment.

| Operation | | Vd | Vcg | Vig | Vs |
|---|---|---|---|---|---|
| Erase | Selected | 0 V or FL | −10 V | 0 V | 0 V or FL |
|   | Deselected | 0 V or FL | 0 V | 0 V | 0 V or FL |
| Program | Selected | 0 V | +10 V | 0 V | 0 V or FL |
|   | Deselected | +5 V | +2.5 V | 0 V | 0 V or FL |
| Read | Selected | ι + 1 V | Vdd | Vdd | 0 V |
|   | Deselected | 0 V | 0 V | Vdd | 0 V |

Figure 9A:
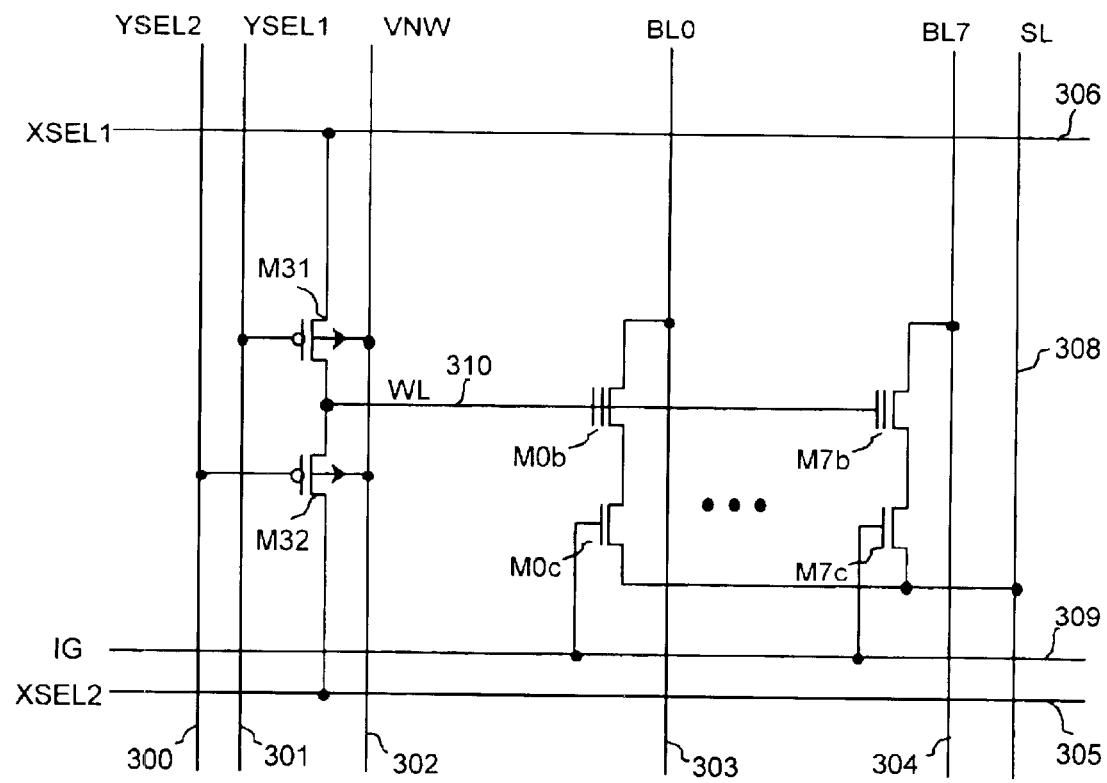
FIG. 9A illustrates a fifth embodiment of the array architecture using the second embodiment of the EEPROM cell.

Referring now to FIG. 9A a fifth embodiment of the array architecture using the two transistor EEPROM cell is shown. The array architecture is basically the same as that used in the second array embodiment of FIG. 6 except that the selection transistors M0a–M7a have been removed.

Therefore, the bit line BL0–BL7 voltages are applied directly to the floating gate devices M0b–M7b. The operating conditions for this embodiment are shown in Table 7.

TABLE 7

Operating Conditions for Fifth Embodiment Array Architecture using Two Transistor EEPROM Cell.

| Op | | XSEL1 | XSEL2 | YSEL1 | YSEL2 | VNW | IG | WL | BL0– BL7 | SL |
|---|---|---|---|---|---|---|---|---|---|---|
| E | S | −10 V | 0 V | [−10 V | 0 V | 0 V | 0 V | −10 V | 0 V/ FL | 0 V/ FL |
|   | D | 0 V | 0 V | 0 V | [−10 V | 0 V | 0 V | FL | 0 V/ FL | 0 V/ FL |

TABLE 7-continued

Operating Conditions for Fifth Embodiment Array Architecture using Two Transistor EEPROM Cell.

| Op | | XSEL1 | XSEL2 | YSEL1 | YSEL2 | VNW | IG | WL | BL0–BL7 | SL |
|---|---|---|---|---|---|---|---|---|---|---|
| P | S | +10 V | 0 V | 0 V | +10 V | +10 V | 0 V | +10 V | 0 V/5 V | 0 V/FL |
|   | D | 0 V | +2.5 V | +10 V | 0 V | +10 V | 0 V | +2.5 V | 0 V/FL | 0 V/FL |
| R | S | VDD | 0 V | 0 V | VDD | VDD | VDD | VDD | ι + 1 V | 0 V |
|   | D | 0 V | 0 V | VDD | 0 V | VDD | 0 V | ιVtp | 0 V/FL | 0 V/FL |

There are two effective ways to solve the bit line disturb problem. First, the length of the bit line can be limited. Second, the voltage on the bit lines and the word lines can be optimized. For example, assume that one bit line has a total of N cells couple to it. Further, assume that each cell can be erased-programmed 100K times, or cycles. Then the maximum total erase and program cycling that a cell couple to this bit line may experience (indirectly) is $(N-1) \times 100K$ times. It is known in the art that the disturbance quantity is a function of the accumulated distubing time. If the total bit line disturbing time is below an acceptable margin, then the bit line disturb problem can be ignored. Otherwise, the number of cells (N) on a bit line needs to be reduced in order to reduce the total bit line disturb time.

Figure 9B:
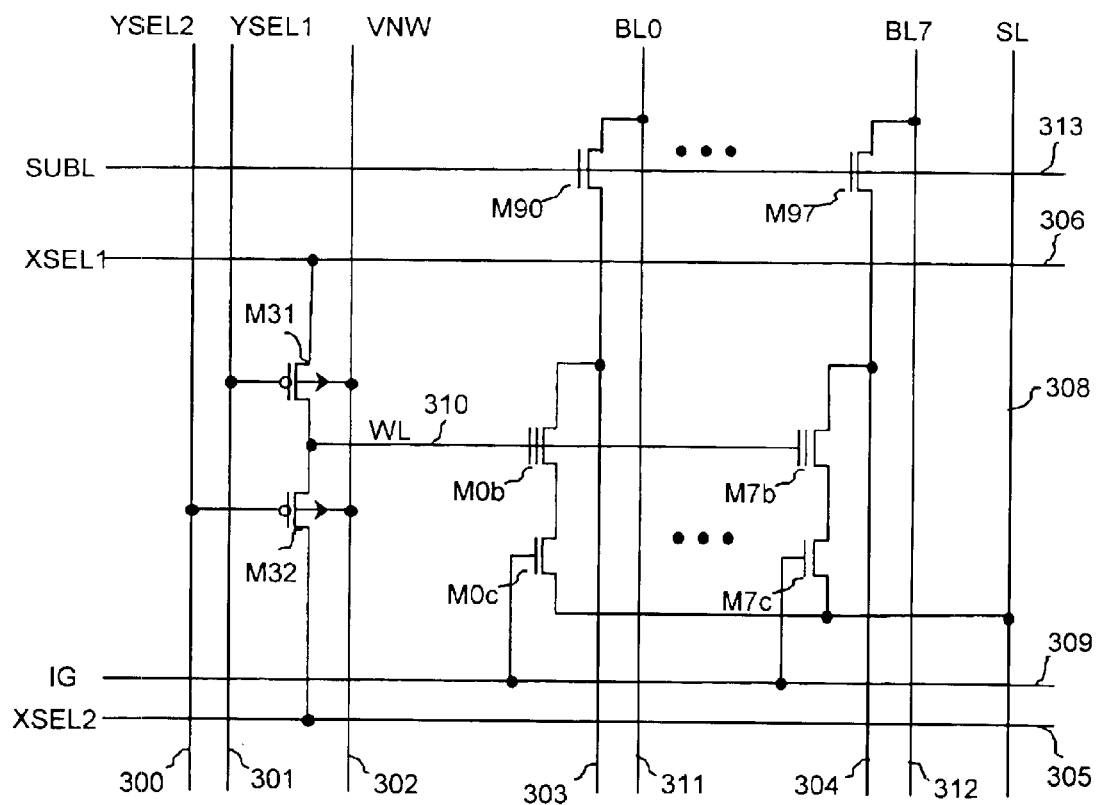
FIG. 9B illustrates a sixth embodiment of the array architecture using the second embodiment of the EEPROM cell wherein a sub-bit line transistor is added to each cell bit line to reduce disturbances.

Referring now to FIG. 9B, a sixth embodiment of an array architecture is shown. To reduce the total accumulated bit line disturb time, the bit line is divided into several segments 303 and 304. These segments are called sub-bit lines. Each sub-bit line 303 and 304 has an optimum number of cells coupled to it. For example, the optimum number of cells may be 32, 64, 128, or 156. The determination of the optimum number of cells is based a trade off between bit line disturb time and the silicon area penalty.

Generally speaking, the smaller the number of cells on each sub-bit line, the shorter the accumulated bit line disturb time can be made. However, this will require a large silicon area to achieve. Each bit line is divided into several sub-bit lines. These sub-bit lines then are coupled to a vertical bit line, called the main bit line 311 and 312 through the selection transistors M90–M97. The sub-bit line selection transistors M90–M97 pass the bit line voltage from the main bit line 311 and 312 to only a selected sub-bit line, such as 303. The bit line voltage is isolated from deselected sub-bit lines. Therefore, the accumulated bit line disturbance is limited to that generated by cells on a common sub-bit line. By carefully selecting the number of cells in each sub-bit line group, the total accumulated bit line disturb time of a cell can be limited to under the acceptable margin that will not create false data. The addition of the sub-bit line transistors, M90–M97 is an effective solution to the problem. The operating conditions for the sixth embodiment of array architecture are shown in Table 8.

TABLE 8

Operating Conditions for Sixth Embodiment Array using Sub-Bit Lines.

| Op | | XSEL1 | XSEL2 | YSEL1 | YSEL2 | VNW | SUBL | IG | WL | BL0–BL7 | SL |
|---|---|---|---|---|---|---|---|---|---|---|---|
| E | S | -10 V | 0 V | [-10 V | 0 V | 0 V | 0 V | 0 V | -10 V | 0 V/FL | 0 V/FL |
|   | D | 0 V | 0 V | 0 V | [-10 V | 0 V | 0 V | 0 V | FL | 0 V/FL | 0 V/FL |
| P | S | +10 V | 0 V | 0 V | +10 V | +10 V | $\mu$ + 5 V | 0 V | +10 V | 0 V/5 V | 0 V/FL |
|   | D | 0 V | +2.5 V | +10 V | 0 V | +10 V | 0 V | 0 V | +2.5 V | 0 V/FL | 0 V/FL |
| R | S | VDD | 0 V | 0 V | VDD | VDD | VDD | VDD | VDD | ι + 1 V | 0 V |
|   | D | 0 V | 0 V | VDD | 0 V | VDD | 0 V | 0 V | ιVtp | 0 V/FL | 0 V/FL |

The other factor regarding the bit line disturb problem is the bit line voltage. If the bit line voltage is reduced, the disturb effect is also reduced. However, the bit line voltage must be sufficiently large to inhibit programming of deselected cells that share the same wordline with a selected cell. Therefore, the bit line voltage is optimized according to the concern to trade off bit line disturbance and word line disturbance. Both conditions have to be fulfilled. For example, according to the exemplary values of the above-mentioned embodiments of the invention, the selected cell word line is driven to is grounded. There is 10 Volt difference between the control gate and the drain diffusion to induce the F-N tunneling. By comparison, during a bit line disturb condition, the deselected cell control gate is grounded, and the drain diffusion is forced to +5 Volts. The voltage difference between the control gate and the drain diffusion is only 5 Volts or about 5 Volts lower than the programmed cell's condition. Consequently, experimental results shown that this 5 Volt difference between the disturb condition and the program condition will allow approximately five orders of magnitude (100K) of the re-program cycles. For the deselected cells that share the same word line with the selected cells, they also have 5 Volts difference between their control gate and drain diffusion. This is because the bit line voltage is so-selected to be half of the voltage difference that is applied to the word line and bit line for the selected cells. It is shown that this voltage setup can well obtain a balance between the bit line disturbance and the word line disturbance.

According to the invention, to further reduce the bit line disturb effect, another optimal voltage of about +2.5 Volts can be applied to the deselected word lines as shown in Table 8. This will further reduce the voltage difference between the control gate and the drain diffusion of the deselected cell from the exemplary 5 Volts to about 2.5 Volts. This will further increase the allowed disturb time to approximately two to three orders of magnitude. It is true that reducing the bit line disturb by increasing the deselected word line voltage will cause a word line disturbance for the cells on these deselected word lines that were initially biased to 0 Volts. However, because the word line voltage is extremely low (about 2.5 Volts), the disturb time of the word line to cause the cell data to become false will be extremely long so that the word line disturbance may be ignored. Consequently, the desired re-program cycle can be achieved.

Referring again to FIG. 6, this second embodiment array architecture has been designed in a 0.35 $\mu$m Flash geometric rule technology using three metal interconnect layers. The resulting layout demonstrated that the word line driver transistors, M31 and M32, take approximately 40% of the overall area. The selection transistors M0a–M7a, floating gate transistors M0b–M7b, and isolation transistors M0c–M7c, and the common source line 308 consume about 60% of the area. The equivalent cell size is about 6 $\mu m^2$. By comparison, the conventional EEPROM cell size is approximately 9 $\mu m^2$ for the same 0.35 $\mu$m Flash technology and about 6 $\mu m^2$ for a 0.25 $\mu$m technology. This result shows the EEPROM cell size according to the present invention is about 33% smaller than the prior art.

The present invention provides an EEPROM cell for use in an integrated circuit memory array. The EEPROM cell is highly scaleable, easy to manufacture, and has high write/erase endurance. The EEPROM cell uses a Flash memory stack with a selection transistor and an isolation transistor such that scalability, manufacturability, and endurance are improved. The EEPROM cell is compatible with different device types wherein the cell transistors may be NMOS, PMOS, and constructed with or without an isolation well. The EEPROM cell can be byte erased and bit programmed. The EEPROM cell eliminates hot carrier effects by eliminating large voltages in the substrate. Several array architectures are provided using the novel EEPROM cell. The array architectures facilitates byte erase and bit program with minimal disturb of unselected cells. The array architectures can handle switching large voltages to the control gate of the EEPROM cells while not creating hot carrier effects.

As shown in the preferred embodiments, the novel EEPROM cell and array architecture provide an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An EEPROM cell device on a substrate, said device comprising:
   a selection transistor having gate, drain, source, and channel, wherein said drain is defined as a cell bit line;
   an isolation transistor having gate, drain, source, and channel, wherein said source is defined as a cell source line; and
   a floating gate transistor having control gate, floating gate, drain, source, and channel, wherein said drains and sources of each said transistor comprise a diffusion layer in said substrate, wherein said channels of each said transistor comprise said substrate, wherein said floating gate transistor drain is coupled to said selection transistor source, wherein said floating gate transistor source is coupled to said isolation transistor drain, wherein said device is programmed and erased by charge tunneling between said floating gate and said floating gate transistor channel, and wherein the having a floating gate dielectric thickness between the entirety of said floating gate transistor floating gate and channel wherein said floating gate dielectric thickness is less than the gate dielectric thicknesses between said selection transistor gate and channel and between said isolation transistor gate and channel.

2. An EEPROM cell device on a substrate, said device comprising:
   a selection transistor having gate, drain, source, and channel, wherein said drain is defined as a cell bit line;
   an isolation transistor having gate, drain, source, and channel, wherein said source is defined as a cell source line; and
   a floating gate transistor having control gate, floating gate, drain, source, and channel, wherein said drains and sources of each said transistor comprise a diffusion layer in said substrate, wherein said channels of each said transistor comprise said substrate, wherein said floating gate transistor drain is coupled to said selection transistor source, wherein isolation transistor drain, wherein said device is programmed and erased by charge tunneling between said floating gate and said floating gate transistor channel, wherein said diffusion layer comprises a p-type doping and said substrate comprises an n-type doping and having a floating gate dielectric thickness between the entirety of said floating gate transistor floating gate and channel wherein said floating gate dielectric thickness is less than the gate dielectric thicknesses between said selection transistor gate and channel and between said isolation transistor gate and channel.

* * * * *

UNITED STATES PATENT AND TRADEMARK OFFICE
CERTIFICATE OF CORRECTION

PATENT NO. : 6,906,376 B1  Page 1 of 1
APPLICATION NO. : 10/170492
DATED : June 14, 2005
INVENTOR(S) : Fu-Chang Hsu and Hsing-Ya Tsao It is certified that error appears in the above-identified patent and that said Letters Patent is hereby corrected as shown below:

Title Page,
In the Assignees, (73), delete Assignee, "A Plus Flash Technology, Inc., San Jose, CA (US)" and replace with -- Aplus Flash Technology, Inc., San Jose, CA (US) --.

Signed and Sealed this

Twentieth Day of January, 2009

JON W. DUDAS
*Director of the United States Patent and Trademark Office*